United States Patent
Murphy et al.

(10) Patent No.: US 7,956,411 B2
(45) Date of Patent: Jun. 7, 2011

(54) HIGH ASPECT RATIO TRENCH STRUCTURES WITH VOID-FREE FILL MATERIAL

(75) Inventors: James J. Murphy, South Jordan, UT (US); Hui Chen, South Jordan, UT (US); Eileen Valdez, South Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 66 days.

(21) Appl. No.: 12/353,909

(22) Filed: Jan. 14, 2009

(65) Prior Publication Data

US 2010/0044785 A1 Feb. 25, 2010

Related U.S. Application Data

(60) Provisional application No. 61/021,294, filed on Jan. 15, 2008.

(51) Int. Cl.
*H01L 29/78* (2006.01)

(52) U.S. Cl. ................... 257/330; 257/E29.262

(58) Field of Classification Search .......... 257/330–333, 257/E29.262
See application file for complete search history.

(56) References Cited

U.S. PATENT DOCUMENTS

| | | | |
|---|---|---|---|
| 6,737,323 B2 | 5/2004 | Mo | |
| 6,809,005 B2 | 10/2004 | Ranade et al. | |
| 7,022,573 B2 * | 4/2006 | Hsiao et al. | 438/259 |
| 7,033,889 B2 * | 4/2006 | Hijzen et al. | 438/259 |
| 7,157,327 B2 | 1/2007 | Haupt | |
| 7,427,800 B2 * | 9/2008 | Yilmaz | 257/488 |
| 2002/0197810 A1 * | 12/2002 | Hanafi et al. | 438/330 |
| 2003/0146470 A1 * | 8/2003 | Hijzen et al. | 257/330 |
| 2003/0178672 A1 * | 9/2003 | Hatakeyama et al. | 257/328 |
| 2004/0036114 A1 * | 2/2004 | Taylor et al. | 257/330 |
| 2005/0001264 A1 * | 1/2005 | Ono et al. | 257/330 |
| 2005/0029587 A1 * | 2/2005 | Harshfield | 257/330 |

\* cited by examiner

*Primary Examiner* — Nathan W Ha

(74) *Attorney, Agent, or Firm* — Fairchild Townsend & Stockton LLP

(57) ABSTRACT

A field effect transistor (FET) includes a trench extending into a semiconductor region. A conductive electrode is disposed in the trench, and the conductive electrode is insulated from the semiconductor region by a dielectric layer. The conductive electrode includes a conductive liner lining the dielectric layer along opposite sidewalls of the trench. The conductive liner has tapered edges such that a thickness of the conductive liner gradually increases from a top surface of the conductive electrode to a point in lower half of the conductive electrode. The conductive electrode further includes a conductive fill material sandwiched by the conductive liner. The FET further includes a drift region of a first conductivity type in the semiconductor region, and a body region of a second conductivity type extending over the drift region. Source regions of the first conductivity type extend in the body region adjacent the trench.

19 Claims, 10 Drawing Sheets

HIGH ASPECT RATIO TRENCH STRUCTURES WITH VOID-FREE FILL MATERIAL

CROSS-REFERENCES TO RELATED APPLICATIONS

This application claims the benefit of U.S. Provisional Application No. 61/021,294, filed on Jan. 15, 2008, which is incorporated herein by reference in its entirety for all purposes.

BACKGROUND OF THE INVENTION

The present invention relates in general to semiconductor technology, and more particularly to structures and methods for forming high aspect ratio trenches. Merely by way of example, the invention has been applied in a shielded gate trench field effect transistor (FET). But it would be recognized that the invention has a much broader range of applicability.

Shielded gate trench FETs and trench gate FETs are widely used in power electronics. In a shielded gate trench FET, the shield electrode reduces the gate-drain capacitance (Cgd) and improves the breakdown voltage of the transistor without sacrificing the transistor on-resistance. FIG. 1 is a simplified cross sectional view diagram of a conventional shielded gate trench MOSFET. An n-type epitaxial layer 102 extends over n+ substrate 101. N+ source regions 108 and p+ heavy body regions 106 are formed in a p-type body region 104 which is in turn formed in epitaxial layer 102. Trench 110 extends through body region 104 and terminates in the drift region which is the portion of epitaxial layer 102 extending between body region 104 and substrate 100. Trench 110 includes a shield electrode 114 below a gate electrode 122. Gate electrode 122 is insulated from its adjacent silicon regions by gate dielectric 120, and shield electrode 114 is insulated from its adjacent silicon regions by a shield dielectric 112 which is thicker than gate dielectric 120. The gate and shield electrodes are insulated from each other by a dielectric layer 116 also referred to as inter-electrode dielectric or IED.

For many applications a key performance characteristic of the trench FET is its switching speed. To maximize the switching speed of the trench FET it is desirable to minimize the resistivity of its gate material. As shown in FIG. 1, both the shield electrode 114 and the gate electrode 122 are formed inside trench 110. With the advancement to technology, device size continues to shrink, and the aspect ratio of trench structures and recesses continues to increase. As a result, conventional methods for forming trench structures and recesses in general suffer many limitations. Some of the limitations are illustrated in FIGS. 2A and 2B and described in more detail further below.

Thus, there is a need for simple and cost effective techniques for filling high aspect ratio trenches and recesses in a void-free manner.

BRIEF SUMMARY OF THE INVENTION

The present invention relates in general to semiconductor technology, and more particularly to methods and structures for high aspect ratio trenches. Merely by way of example, the invention has been applied to a method for void free filling of trenches and recesses with conductive materials. In a specific embodiment, the trench or recess is first partially filled with a first conductive material which is etched back such that the remaining portion of the first conductive material has sidewalls with a positive slope. A second conductive material is then used to fill the trench or recess such that the trench is substantially void free. A method is also provided for filling a trench with reentrant sidewalls. These and other embodiments will be briefly described next.

In accordance with one embodiment of the invention, a field effect transistor (FET) includes a trench extending into a semiconductor region. A conductive electrode is disposed in the trench, and the conductive electrode is insulated from the semiconductor region by a dielectric layer. The conductive electrode includes a conductive liner lining the dielectric layer along opposite sidewalls of the trench. The conductive liner has tapered edges such that a thickness of the conductive liner gradually increases from a top surface of the conductive electrode to a point in lower half of the conductive electrode. The conductive electrode further includes a conductive fill material sandwiched by the conductive liner. The FET further includes a drift region of a first conductivity type in the semiconductor region, and a body region of a second conductivity type extending over the drift region. Source regions of the first conductivity type extend in the body region adjacent the trench.

In one embodiment, both the conductive liner and the conductive fill material comprise polysilicon.

In another embodiment, the conductive liner comprises polysilicon and the conductive fill material comprises metal-containing material.

In another embodiment, the conductive electrode is a gate electrode and the dielectric layer is a gate dielectric layer.

In another embodiment, the trench further includes a thick bottom dielectric extending along the bottom of the trench directly below the gate electrode.

In another embodiment, the conductive liner is discontinuous along a bottom of the conductive electrode so that the conductive liner comprises discrete conductive spacers extending over the dielectric layer along opposite sidewalls of the trench.

In another embodiment, the conductive liner extending along opposite sidewalls of the trench is continuous along a bottom of the conductive electrode.

In another embodiment, the conductive electrode is a shield electrode disposed in a lower portion of the trench, and the dielectric layer is a shield dielectric layer lining lower trench sidewalls.

In another embodiment, a gate dielectric layer lines upper trench sidewalls. A gate electrode is disposed in the trench over the shield electrode, and an inter-electrode dielectric layer extends laterally between the gate and shield electrodes.

In another embodiment, the gate electrode includes a conductive liner lining the gate dielectric layer, and the conductive liner has tapered edges such that a thickness of the conductive liner gradually increases from a top surface of the gate electrode to a point in lower half of the gate electrode. A conductive fill material in the trench is sandwiched by the conductive liner.

In another embodiment, the top surface of the conductive electrode is non-planar. In one variation, the fill material protrudes above the conductive liner, and in another variation, the fill material is recessed relative to the conductive liner. In still another embodiment, the top surface of the conductive electrode is substantially planar.

In accordance with another embodiment, a field effect transistor (FET) includes a semiconductor region comprising a drift region of a first conductivity type and a body region of a second conductivity type extending over the drift region. The FET further includes a gate electrode insulated from the body region by a gate dielectric layer. Source regions of the first conductivity type extend in the body region. A heavy body recess extends in the body region, and includes a conductive liner lining opposite sidewalls of the heavy body recess. The conductive liner has tapered edges such that a thickness of the conductive liner gradually increases from the top of the heavy body recess to a point in lower half of the heavy body recess. A conductive fill material fills a center portion of the heavy body recess and is sandwiched by the conductive liner.

In one embodiment, the gate electrode is disposed in a trench extending through the body region and into the drift region.

In another embodiment, the gate electrode is a planar gate laterally extending over the semiconductor region.

In another embodiment, the conductive liner is discontinuous along a bottom of the heavy body recess so that the conductive liner comprises discrete conductive spacers extending along opposite sidewalls of the heavy body recess.

In another embodiment, the conductive liner extending along opposite sidewalls of the heavy body recess is continuous along a bottom of the heavy body recess.

In another embodiment, a heavy body implant region extends in the body region along a bottom of the heavy body recess, and the conductive liner is in direct contact with the heavy body implant region along the bottom of the heavy body recess.

In accordance with yet another embodiment of the invention, a method for forming a trench gate field effect transistor includes forming a trench in a semiconductor region. A conductive electrode is formed in the trench. The conductive electrode is insulated from the semiconductor region by a dielectric layer, the step of forming a conductive electrode includes: forming a conductive liner lining the dielectric layer along opposite sidewalls of the trench, the conductive liner having tapered edges such that a thickness of the conductive liner gradually increases from a top surface of the conductive electrode to a point in lower half of the conductive electrode; and forming a conductive fill material filling an opening formed by the conductive liner. A body region of a first conductivity type is formed in the semiconductor region, and source regions of the first conductivity type are formed in the body region.

In one embodiment, both the conductive liner and the conductive fill material comprise polysilicon.

In another embodiment, the conductive liner comprises polysilicon and the conductive fill material comprises metal-containing material.

In another embodiment, the conductive electrode is a gate electrode and the dielectric layer is a gate dielectric layer.

In another embodiment, the method further includes: before forming the gate electrode, forming a thick bottom dielectric extending along the bottom of the trench.

In another embodiment, the conductive liner is discontinuous along a bottom of the conductive electrode so that the conductive liner comprises discrete conductive spacers extending over the dielectric layer along opposite sidewalls of the trench.

In another embodiment, the conductive liner extending along opposite sidewalls of the trench is continuous along a bottom of the conductive electrode.

In another embodiment, the conductive electrode is a shield electrode disposed in a lower portion of the trench, and the dielectric layer is a shield dielectric layer lining lower trench sidewalls.

In another embodiment the method further includes: forming a gate dielectric layer lining upper trench sidewalls, the shield dielectric layer being thicker than the gate dielectric layer; and forming a gate electrode disposed in the trench over the shield electrode, the gate and shield electrode being insulated from one another by an inter-electrode dielectric layer.

In another embodiment, the step of forming a gate electrode includes: forming a conductive liner lining the gate dielectric layer, the conductive liner of the gate electrode having tapered edges such that a thickness of the conductive liner of the gate electrode gradually increases from a top surface of the gate electrode to a point in lower half of the gate electrode, and forming a conductive fill material filling an opening formed by the conductive liner of the gate electrode.

In another embodiment, the conductive liner is formed using a bevel etch process or an anisotropic etch process.

Various additional features and advantages of the present invention can be more fully appreciated with reference to the detailed description and accompanying drawings that follow.

DETAILED DESCRIPTION OF THE INVENTION

The present invention relates in general to semiconductor technology, and more particularly to structures and methods for forming high aspect ratio trenches and recesses. Merely by way of example, the invention has been applied to a method for void free filling of a trench with conductive materials in forming the shield electrode in shielded gate trench field effect transistors (FETs). In a specific embodiment, the trench is first partially filled with a first conductive material, which is etched back to provide a positive sidewall slope. A second conductive material is then used to fill the trench such that the trench is substantially void free. A method is also provided for filling a trench with reentrant sidewalls.

Figure 1:
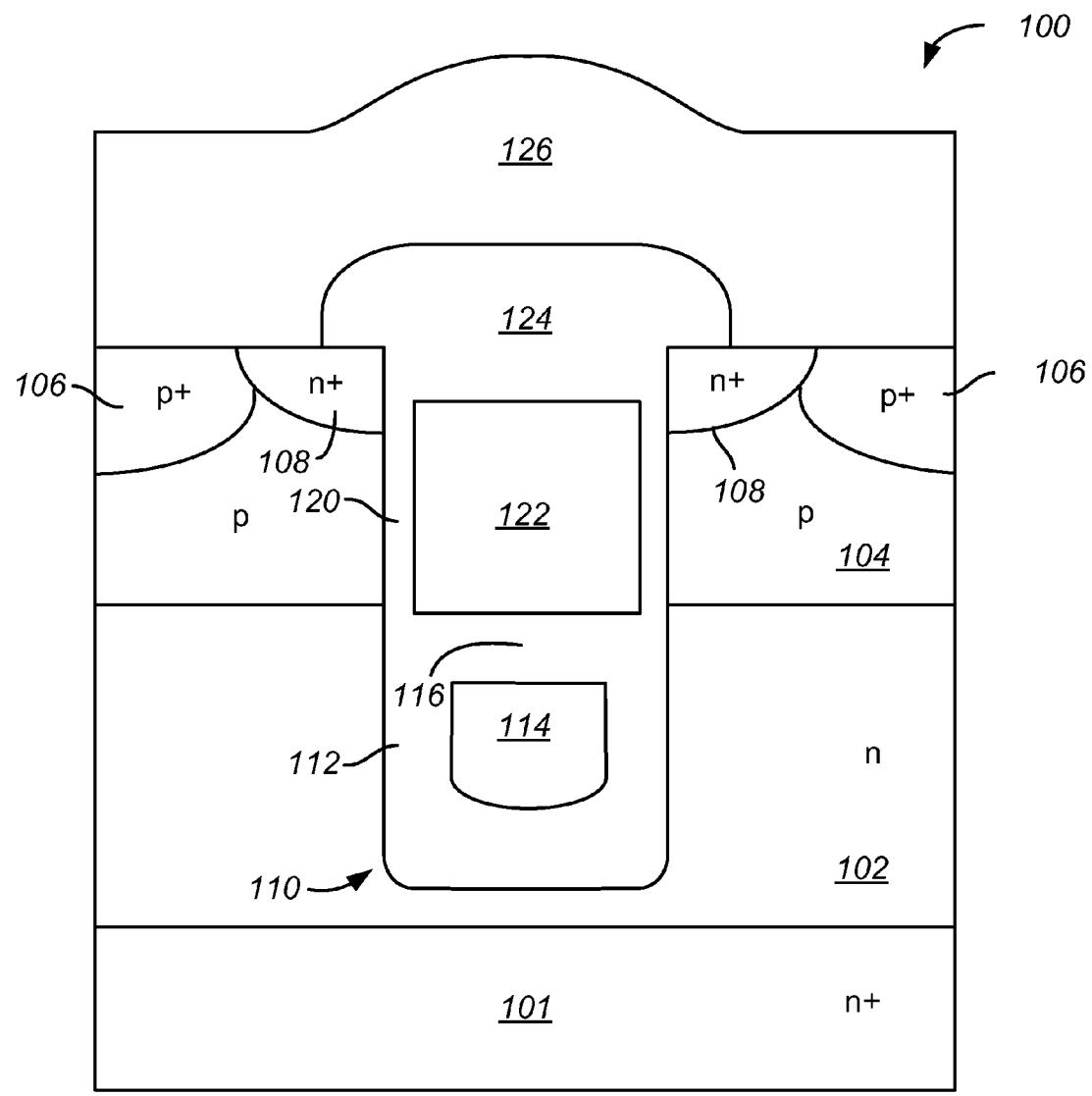
FIG. 1 is a simplified cross-sectional view illustrating a conventional shielded gate MOSFET.
Figure 2A:
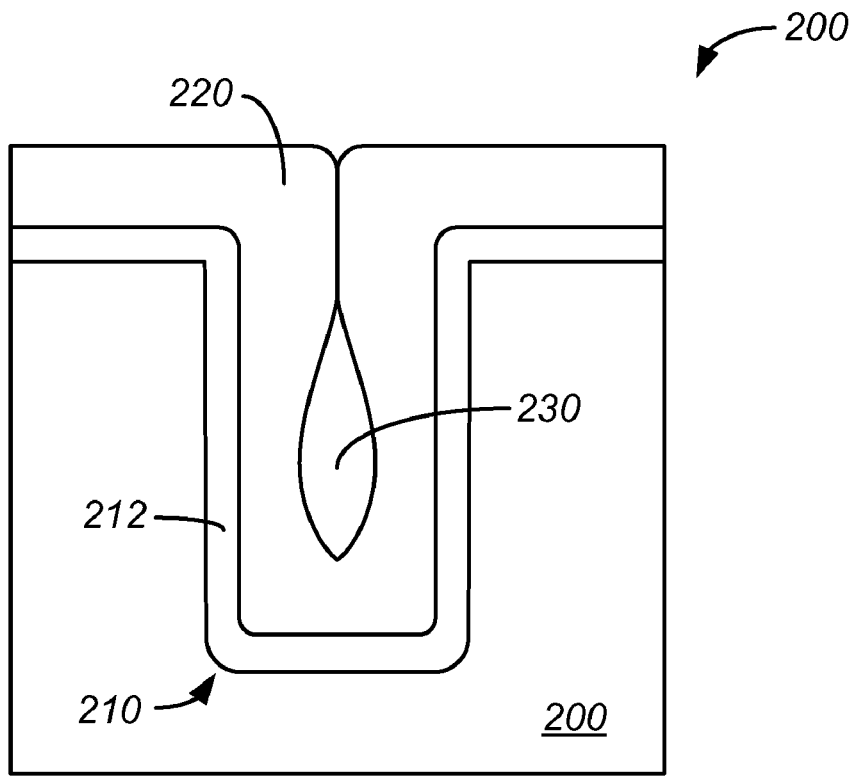
FIGS. 2A and 2B are simplified cross-sectional views illustrating conventional trench filling and etch back methods.
Figure 2B:
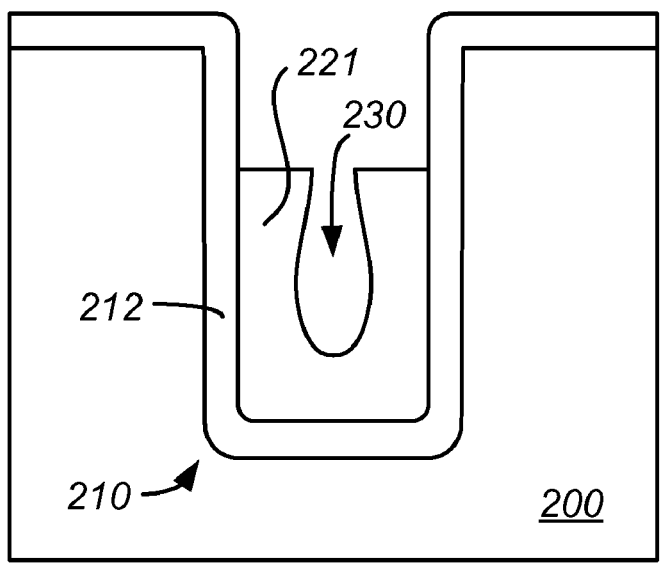

In forming a shielded gate FET, a conductive material is used to fill a trench and then etched back to thereby form a shield electrode in a bottom portion of the trench. FIG. 2A illustrates a conventional trench filling method. A trench 210 is formed in substrate 200. A dielectric layer 212 is formed lining the sidewall and bottom surface of the trench. Then a conductive material 220, such as polysilicon, is deposited to fill the trench. As shown in FIG. 2A, even though the top portion of the trench is filled with conductive material 220, a void 230 is formed inside the trench. In a chemical vapor deposition (CVD) or physical vapor deposition (PVD) process, the deposited material often is not conformal. As the aspect ratio of the trench becomes higher, it becomes more difficult to fill a trench without a void. In FIG. 2B, the conductive material 220 is etched back in a process similar to that used in forming a shielded gate. It can be seen that the remaining conductive material 221 includes the void 230. Such a void is undesirable for many reasons. For example, the void can cause an increase in the resistance of the conductive material and degrade device performance. It can also trap particles or contaminants and cause reliability problems.

Figure 3A:
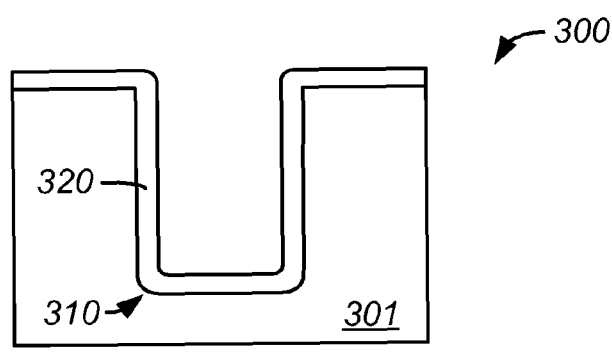
FIGS. 3A-3D are simplified cross-sectional views illustrating a method for forming a trench structure according to an embodiment of the present invention.

A method of fabricating a trench structure according to an embodiment of the present invention will be described hereinafter using the cross-sectional views shown in FIGS. 3A-3D and the flow chart of FIG. 3E. Referring to FIG. 3A, a trench 310 is formed in a semiconductor region 301, for example, an epitaxial layer that extends over a semiconductor substrate (not shown). A dielectric layer 320 is formed lining the trench sidewalls and bottom and extending over mesa regions adjacent the trench. Dielectric layer 320 is typically made of silicon dioxide but could be made of other dielectric material such as a nitride, or oxynitride. It is to be understood that any one of a number of known trench processes can be employed for performing these or similar steps to prepare the structure up to this point.

Figure 3B:
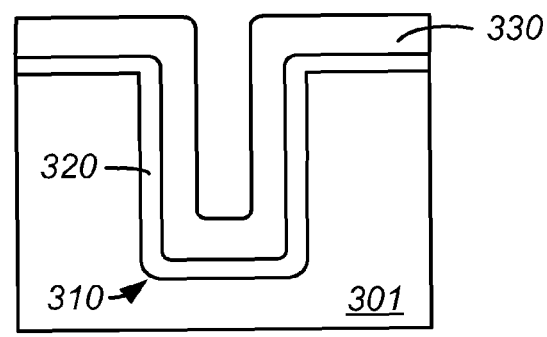

Referring to FIG. 3B, after the formation of dielectric layer 320, a layer of conductive material 330 is deposited over the substrate to partially fill trench 310. As shown, conductive material 330 overlies dielectric material 320 and partially fills the trench. In a specific embodiment, the thickness of conductive material 330 is less than half the width of the trench opening, so the trench is partially filled.

Conductive material 330 can be any material having relatively low resistivity and, in one embodiment, comprises a material which can withstand high processing temperature. For example, conductive material 330 can be doped polysilicon. Alternatively, a refractive metal such as W, Ti, Co, or a metal silicide such as $WSi_2$, $TiSi_2$ may be used. It is understood that as used herein the term "polysilicon" includes polysilicon and amorphous silicon. Polysilicon layer 330 can be doped using conventional doping processes such as $POCl_3$ for n-type poly, p-type (e.g., boron) or n-type (e.g., phosphorous) implant for p or n type poly, respectively, or in-situ doping of n or p type dopants.

Figure 3C:
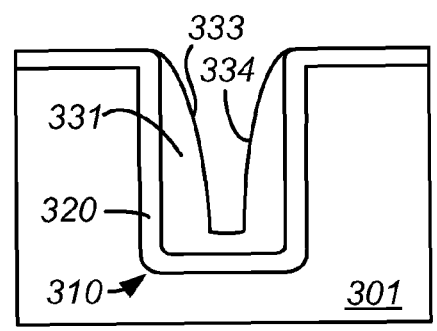

Next, in FIG. 3C, a portion of polysilicon layer 330 is removed such that remaining polysilicon liner 331 extends from top corners of the trench toward the bottom of the trench and provides positive sidewall slopes 333, 334 in the remainder of the trench. A bevel etch process may be used. As can be seen, the positive sidewall slopes provide a wider opening at the top of the trench than near the bottom of the trench.

A conventional anisotropic etch process, such as a reactive ion etch (RIE) process, can be used. Alternatively, a combination of anisotropic and isotropic etch processes can be combined to tailor the contours of conductive liner 331. As shown, the polysilicon is fully removed from over the mesa regions adjacent the trench. In an alternative embodiment, positive sidewall slopes can also be obtained with polysilicon partially remaining on the mesa regions.

Figure 3D:
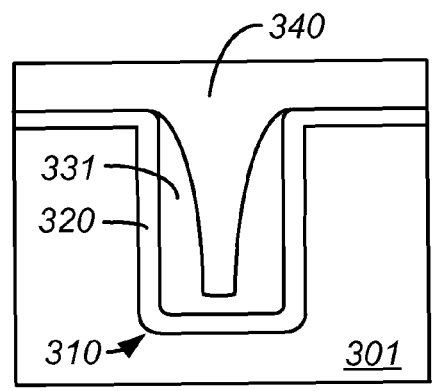
Figure 4A:
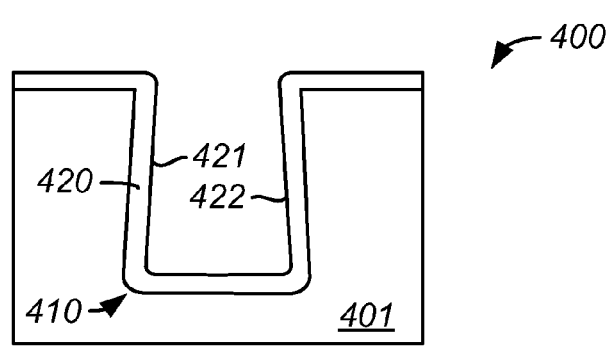
FIGS. 4A-4D are simplified cross-sectional views illustrating a method for forming a trench structure with a reentrant trench profile according to another embodiment of the present invention.
Figure 4B:
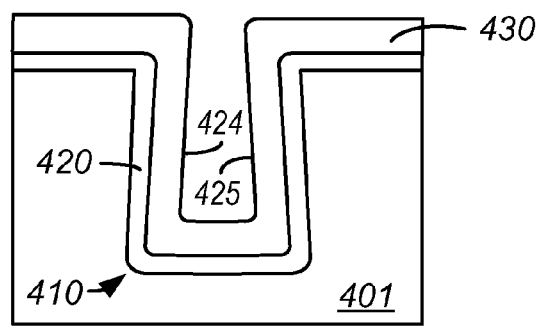
Figure 4C:
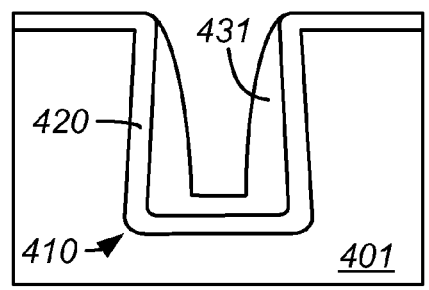
Figure 4D:
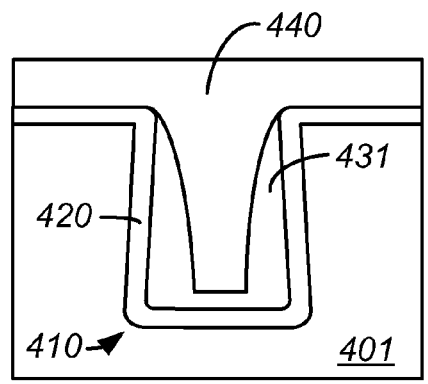

Next, in FIG. 3D, a layer of high-conductivity material 340 is deposited over conductive liner 331 to substantially fill the remainder of the trench. The layer of high-conductivity material 340 may be doped polysilicon or any type of refractory metal such as tungsten, tungsten silicide, titanium, cobalt, platinum, or the like. A polysilicon layer can be formed using a low-pressure chemical vapor deposition (LPCVD) process. Refractive metals can be deposited using a chemical vapor deposition (CVD) or a physical vapor deposition (PVD) process.

In a specific embodiment, the method may also include removing a native oxide layer from an exposed surface of the first conductive material prior to substantially filling the remainder of the trench with the second conductive material. Alternatively, after forming highly conductive material 340, heat cycles may be used to allow the native oxide to absorb into poly liner 331 and/or highly conductive material 340. Native oxides can form over the surface of conductive liner 331 and can deteriorate the contact between the conductive spacers and second conductive material 340. In certain applications, it may be advantageous to include a native oxide removal process in the method.

As can be seen in FIG. 3D, trench 310 is filled with conductive material 340 and conductive liner 331. The wider trench opening provided by conductive liner 331 enables trench 310 to be filled in a substantially void free manner. The structure in FIG. 3E can be used in further device processing. Some examples will be provided below.

The method of FIGS. 3A-3D can also be used for filling a trench having a reentrant profile, which makes trench filling even more difficult. FIGS. 4A-4D are simplified cross section views illustrating a method for filling a reentrant trench according to another embodiment of the present invention. As shown, trench 410 in FIG. 4A has a reentrant profile, that is, the trench sidewalls have negative slopes resulting in a narrower opening at the top of the trench and wider spacing inside the trench. The method depicted in FIGS. 4A-4D is similar to the method of FIGS. 3A-3D. Trench 410 is first partially filled with a first conductive material 430 which has sidewalls 424 and 425 having negative slopes. Parts of conductive material 430 are removed, and conductive liner 431 is formed. Conductive liner 431 has positive sidewall slopes. A wider opening is provided which allows a second conductive material 440 to be formed thus providing substantially void free filling of the trench. In the case where the trench sidewalls have relatively large negative slopes, it may be necessary to repeat the steps of depositing and etching back a conductive material (such as polysilicon) a number of times to ensure that the no voids are formed.

The techniques described above in connection with FIGS. 3A-3E and FIGS. 4A-4D can be used in forming trench gate and shielded gate trench transistors, as discussed next. FIGS. 5A-5G are simplified cross-sectional views illustrating a process flow for forming a shielded gate trench field effect transistor according to an embodiment of the present invention. The following description of the steps in the process flow is only exemplary, and it should be understood that the scope of the invention is not limited to this specific example. In particular, processing conditions such as temperature, pressure, and layer thicknesses could be varied without departing from the spirit of the invention.

Figure 5A:
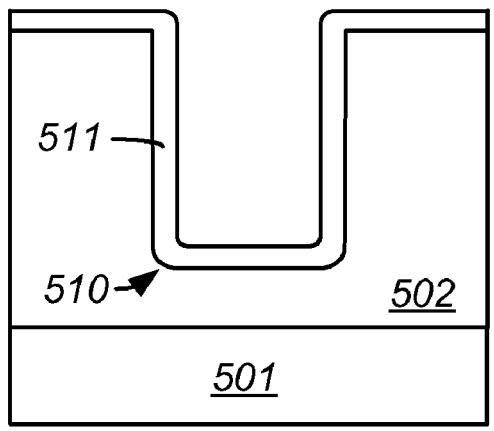
FIGS. 5A-5I are simplified cross-sectional views illustrating a method for forming a shielded gate MOSFET according to an embodiment of the present invention.
Figure 5B:
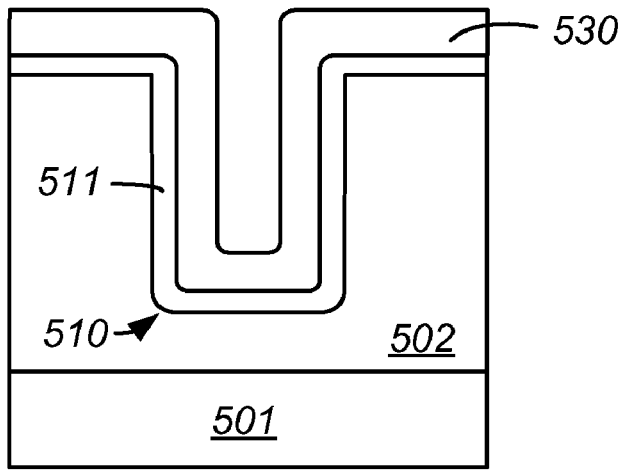
Figure 5C:
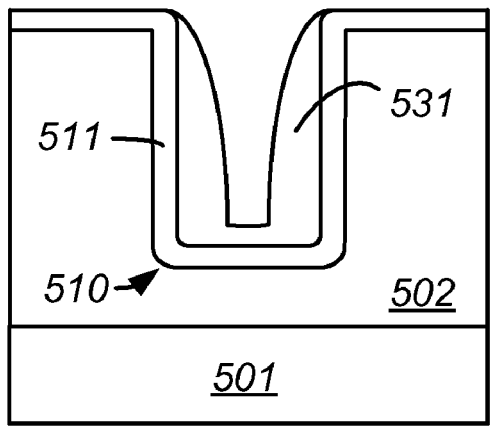

In FIG. 5A, using conventional techniques, trench 510 is formed in a semiconductor region, for example, a silicon region. In one embodiment the semiconductor region includes a highly doped substrate 501 (e.g., n-type in case of an n-channel MOSFET) and an epitaxial layer 502 (e.g., n-type in case of an n-channel MOSFET) overlying substrate 510. Trench 510 extends into and terminates within epitaxial layer 502. In another variation, trench 510 extends through the epitaxial layer and terminates within the substrate. Note that the various dimensions in the figures of this application are not to scale and at times are exaggerated or reduced in size to more clearly show various structural features.

In FIG. 5A, shield dielectric layer 511 is formed lining the trench sidewalls and bottom and extending over mesa regions adjacent the trench, using conventional techniques. In one embodiment, shield dielectric layer 511 is formed to the desired thickness using thermal oxidation of silicon. The steps depicted in FIGS. 5B and 5C for forming conductive liner 531 are similar to those depicted in FIGS. 4B and 4C described above, and thus will not be described.

Figure 5D:
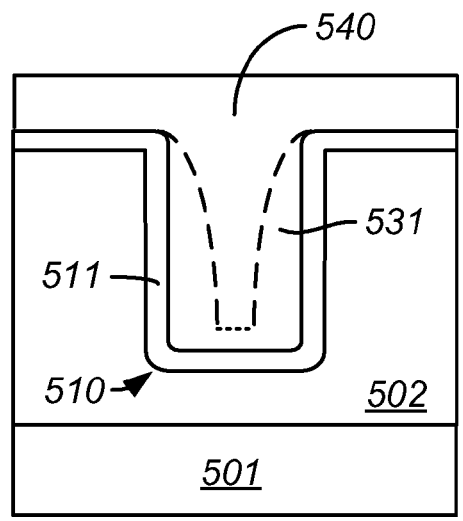
Figure 5E:
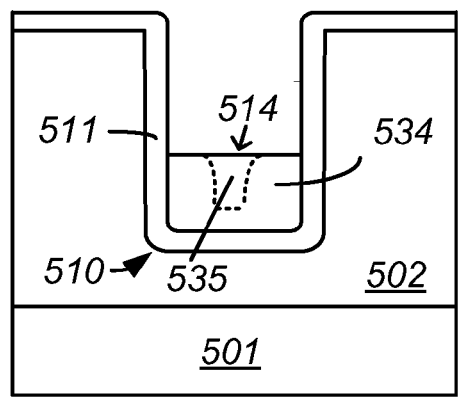

In FIGS. 5D-5E, a shield electrode is formed in a bottom portion of trench 510. As shown in FIG. 5D, using known techniques, a second conductive material 540 (e.g., comprising doped or undoped polysilicon or various metal-containing materials mentioned above) is formed to fill the trench and extending over the mesa regions. Subsequently, as shown in FIG. 5E, conductive liner 531 and conductive fill material 540 are recessed deep into trench 510 to form shield electrode 514. Shield electrode 514 thus includes portion 534 remaining from conductive liner 531 and portion 535 remaining from second conductive material 540. As shown, portion 535 is sandwiched by portion 534. One or multiple etch processes may be necessary depending on whether conductive liner 531 and conductive fill material 540 are of the same or different material, and whether a shield electrode with a planar or non-planar surface is desired. For example, it may be desirable to recess fill material 540 deeper than liner 531 or vice versa depending on the desired characteristics of the shield electrode itself or of the subsequent materials formed in the trench (e.g., IED 516, gate dielectric 520 and gate electrode 522).

Figure 5F:
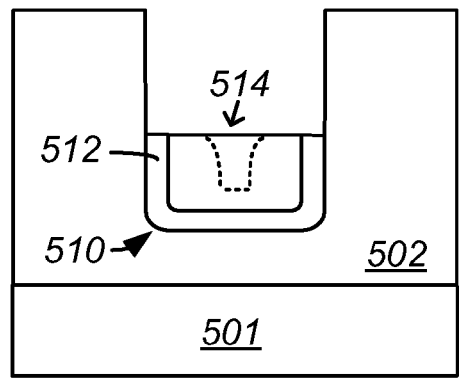
Figure 5G:
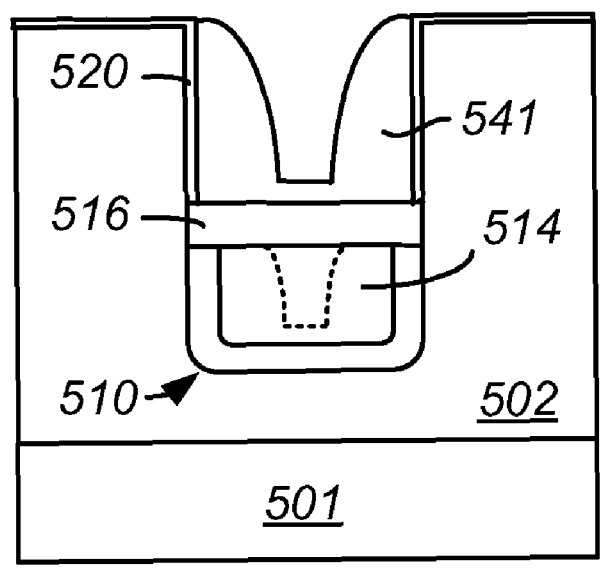

In FIG. 5F, using known dielectric etch methods, exposed portions of shield dielectric layer 511 along upper trench sidewalls and over mesa surfaces are removed. The remaining portion of the shield dielectric is labeled 512. In FIG. 5G, an inter-electrode dielectric (IED) 516 is formed over shield electrode 514. In one embodiment, polysilicon shield electrode 514 is oxidized using a conventional oxidation process to form IED 516. In an alternate embodiment, a dielectric layer is deposited over shield electrode 514. In still another embodiment, a combination of oxidation and dielectric deposition are used to form IED 516. Gate dielectric 520 is then formed lining upper trench sidewalls using known methods. In an alternate embodiment, the process for forming gate dielectric 520 can be used to also form IED 516 (i.e., eliminate separate processing for forming IED 516).

Figure 5H:
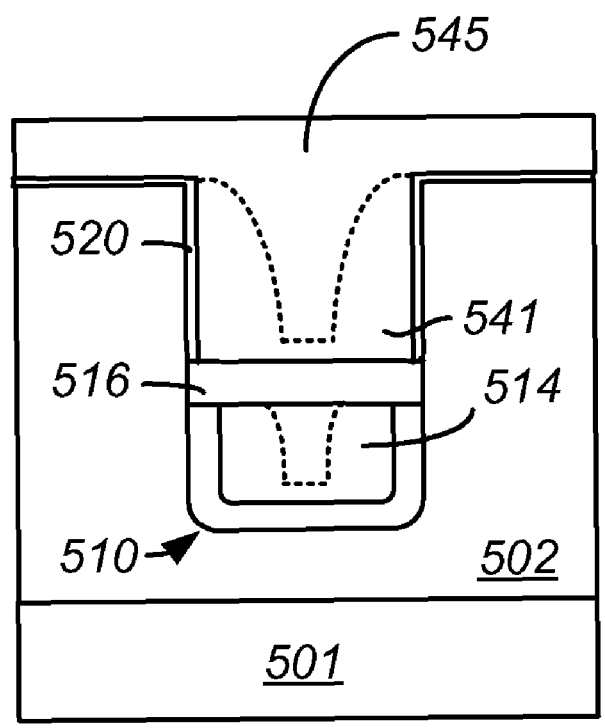
Figure 5I:
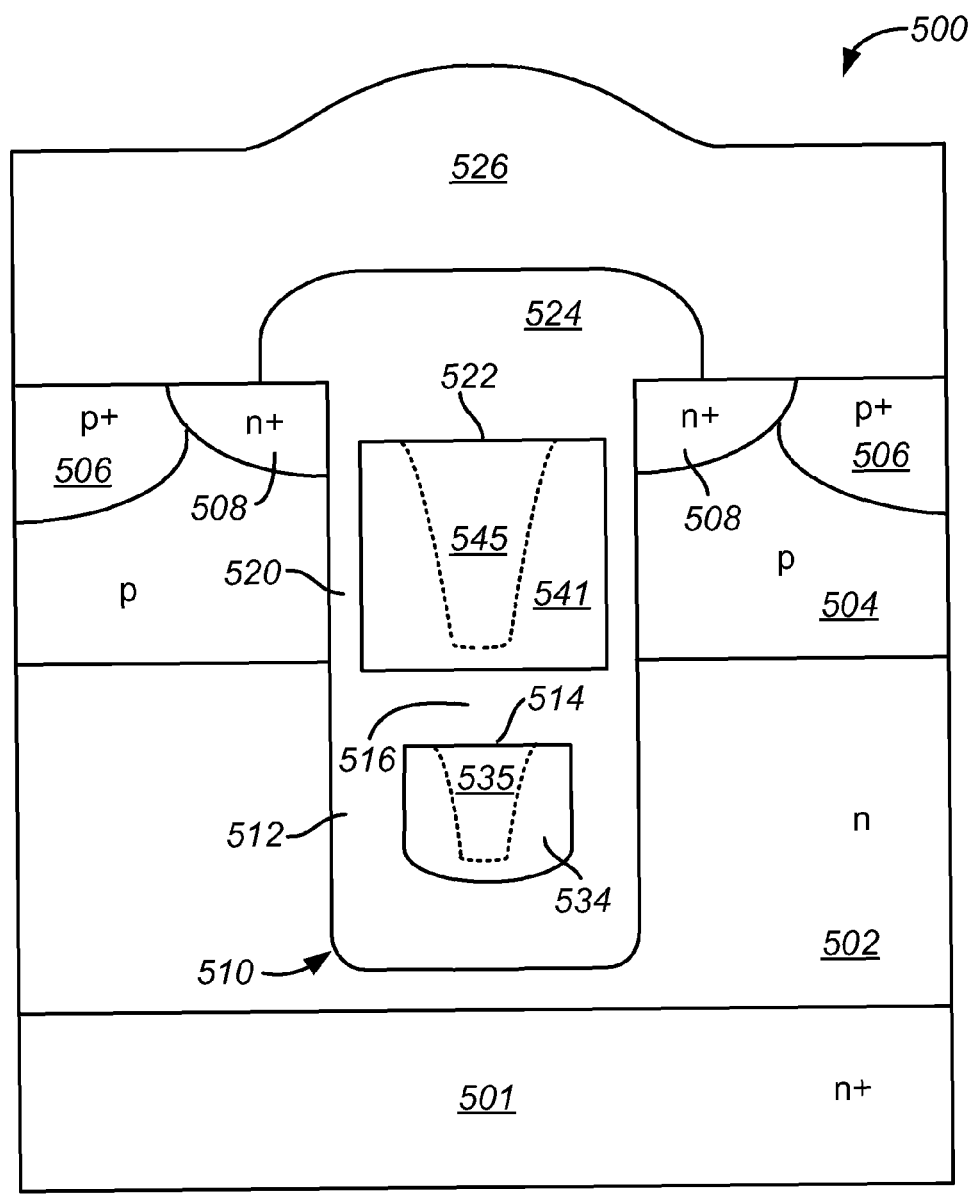

Using conventional techniques (not shown), a second conductive layer (e.g., comprising doped polysilicon or a metal-containing material such as silicide or refractory metal) is formed filling trench 510 and extending over the mesa surfaces. The second conductive material is then recessed in trench 510 thus forming the gate electrode. In an alternate embodiment, the gate electrode is formed using the method of FIGS. 3A-3D or 5A-5D. An example of this embodiment is shown in FIG. 5G-5H, in which a first conductive material is deposited and partially removed to form conductive liner 541, and then a second conductive material 545 is deposited to fill the remaining portion of the trench. Liner 541 and second conductive material 545 are then recessed into trench 510 to form gate electrode 522, as shown in FIG. 5I. Void-free gate and shied electrodes can thus be formed.

Any number of known process steps may next be carried out to complete the trench FET structure. FIG. 5I shows one exemplary trench gate MOSFET structure 500. P-type body region 504, n-type source regions 508, and p-type heavy body regions 506 are formed in n-type epitaxial layer 502 using conventional implanting and drive-in techniques. The portion of epitaxial layer 502 bounded by body region 304 and substrate 501 is commonly referred to as the drift region and is lighter doped than substrate 501. Dielectric cap 524 (e.g., comprising BPSG) is formed over gate electrode 522 using known techniques. Top-side interconnect layer 526 (e.g., comprising metal) is formed to electrically contact source regions 508 and heavy body regions 506. Back-side drain interconnect (not shown) is formed on the back side to electrically contact heavily doped n-type substrate 501 using known methods. The back-side drain interconnect can be formed using a suitable conductor, e.g., a metal.

Note in FIG. 5I, both shield electrode 514 and gate electrode 522 are formed using the method described above in connection with FIGS. 3A-3E or 5A-5H. In this embodiment, shield electrode 514 is shown to have two regions: region 534 is formed using a first conductive material, such as polysilicon, and region 535 is formed using a second conductive material which can be polysilicon or a metal-containing material such as silicide or a refractory metal. Similarly, gate electrode 522 also has two regions: region 541 is formed using a first conductive material, such as polysilicon, and region 545 is formed using a second conductive material which can be polysilicon or a metal-containing material such as silicide or a refractory metal. In other embodiments, only one of shield electrode 514 or gate electrode 522 can be formed using the method described above while the other electrode is formed using conventional techniques.

In FIGS. 5A-5I, the trench structure is formed as part of a trench transistor in a process in which forming the trench and the material therein occurs before the doped junctions (e.g., well, source regions and heavy body regions) are formed. In such embodiment, using polysilicon for both conductive regions of each of the gate and shield electrodes is preferred over a metallic compound given the high temperature cycles associated with the implant and drive in of junctions such as the well and source regions. In another embodiment, the trench structure and the material therein are formed after the well implant and drive-in.

As discussed above, the present invention provides a method for forming a shielded gate FET in which a first conductor partially filling the trench is etched back to provide positive sidewall slopes. A second conductive material is then used to fill the trench such that the trench is substantially void free. The conductive materials are then etched to form the shield electrode. The method can also be used in forming the gate electrode.

Figure 6:
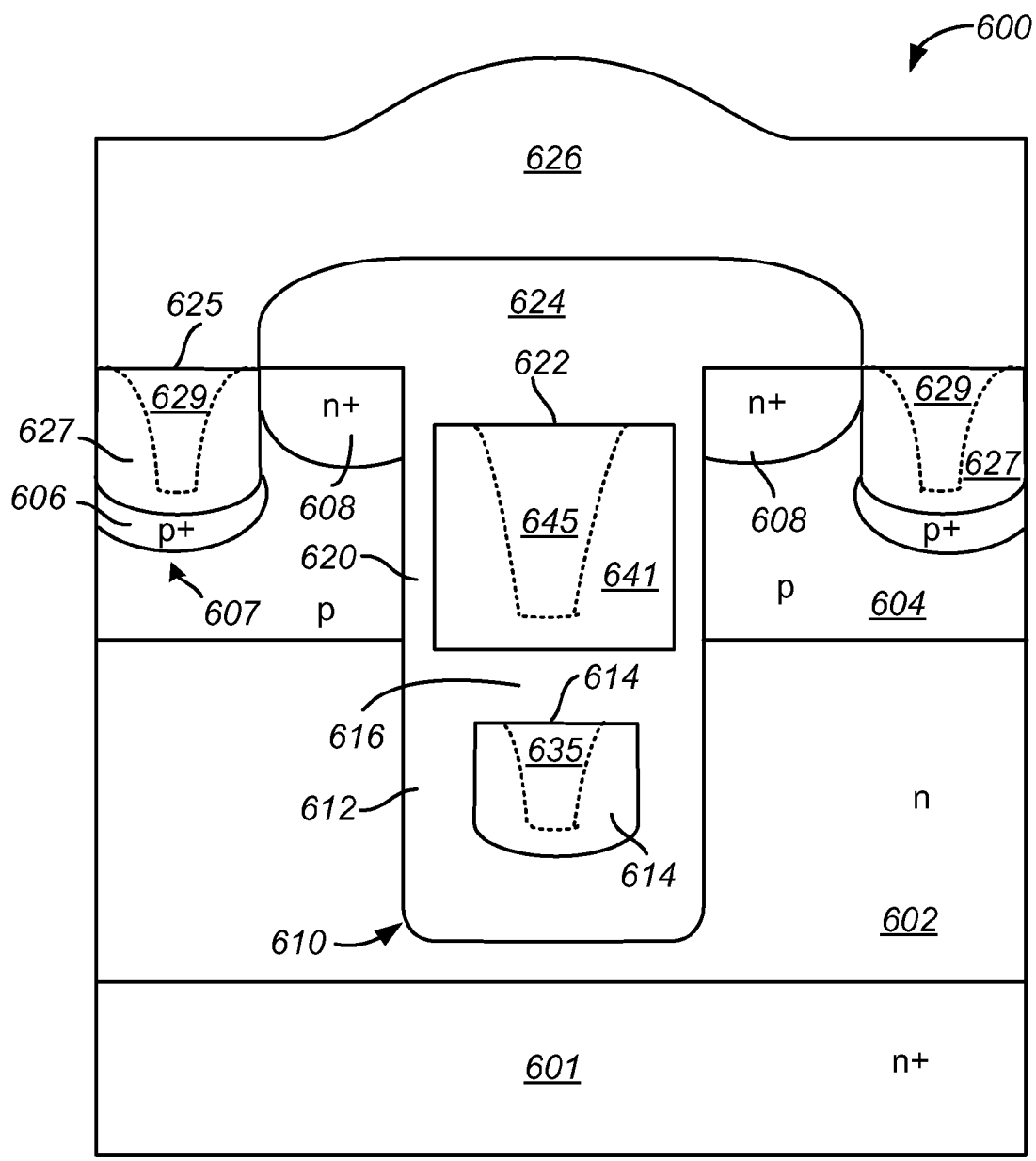
FIG. 6 is a simplified cross-sectional view illustrating a trench gate MOSFET with heavy body recesses formed according to another embodiment of the present invention.

FIG. 6 is a cross-sectional view diagram illustrating a trench gate MOSFET 600 according to another embodiment of the present invention. Trench gate MOSFET 600 is similar to trench gate transistor 500 in FIG. 5. As shown, trench gate MOSFET 600 includes a trench 610 extending into drift region 602, with gate electrode 622 and shield electrode 614 disposed in the trench. The shield and gate electrodes are insulated from the surrounding semiconductor region by shield dielectric 612 and gate dielectric 620, respectively. Trench gate MOSFET 600 also includes body region 604 of p-type conductivity extending over drift region 602. Source regions 608 of n-type conductivity type extend in body region 604 adjacent to the trench.

Additionally, MOSFET 600 has a heavy body contact region 607, which includes a heavily doped p-type diffusion region 606 and recess regions 625 filled with conductive materials. As the lateral cell pitch continues to shrink, the aspect ratio of heavy-body recesses increases, thus making it more difficult to fill the recesses in a void-free manner. In one embodiment, the methods described above can be used for void-free filling of recesses 625. In the embodiment shown, reach recess region 625 includes conductive liner 627 made of a first conductive material and a center region 629 made of a second conductive material sandwiched by conductive liner 627. Depending on the embodiment, various conductive materials can be used. For example, conductive liner 627 and second conductive material may comprise heavily doped polysilicon and/or a metal-containing material such as silicide or a refractory metal such as W, Ti, etc. Alternatively, center region 625 may form part of top-side source interconnect 626 which can comprise aluminum or a metal-containing material such as silicide or a refractory metal such as W and Ti.

Figure 7:
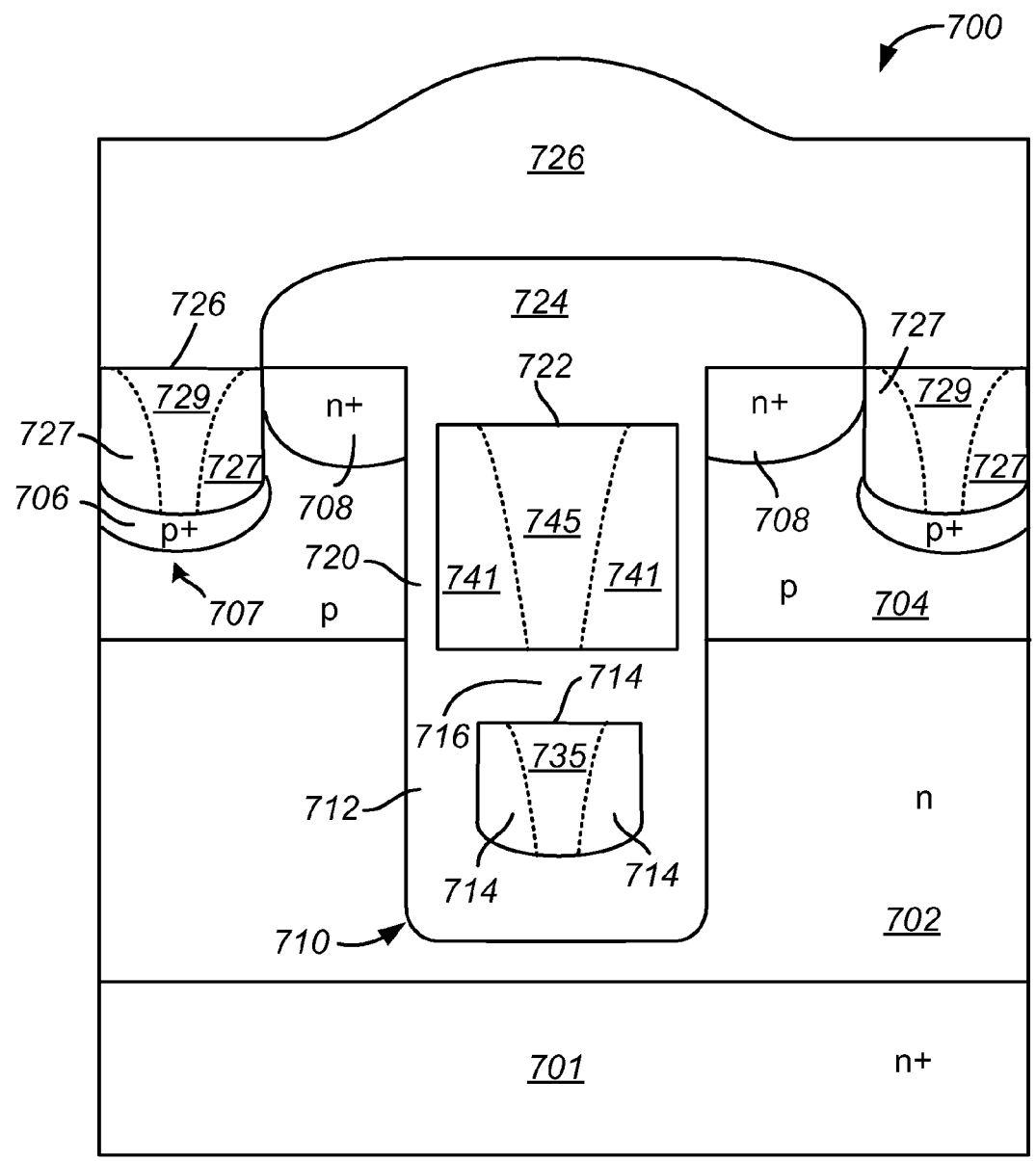
FIG. 7 is a simplified cross-sectional view illustrating a trench gate MOSFET with gate electrode, shield electrode, and heavy body recesses formed according to yet another embodiment of the present invention.

In the embodiments described above, the conductive liner sandwiching the center conductive material in the trench or in the heavy body recess was etched such that a thickness of the conductive liner gradually increases from top to bottom with the conductive liner fully covering the bottom of the trench or recess. However, in some embodiments, depending on the depth of the opening and the type of etch used, a portion of the conductive liner extending along the bottom of the opening may be completely removed thereby forming discrete conductive spacers along sidewalls of the opening with a bottom surface of the opening becoming exposed. FIG. 7 is a cross section view showing an embodiment wherein such spacers are formed. The shielded MOSFET shown in FIG. 7 is substantially similar to that in FIG. 6 except that shield electrode 714, gate electrode 722 and heavy body recess contact 726 have a different structure. Each of shield electrode 714, gate electrode 722 and heavy body recess contact 726 includes conductive spacers that extend along sidewalls of the respective openings but are discontinuous along the bottom of the openings. Thus, each of shield electrode 714, gate electrode 722 and heavy body recess contact 726 includes three distinct regions: shield electrode 714 includes outer spacers 714 and central conductive region 735; gate electrode 722 includes outer spacers 741 and central conductive region 745; and heavy body contact includes outer spacers 727 and central conductive region 729.

Many benefits are achieved by various embodiments of the invention. For example, gate and/or shield electrodes are formed substantially free of voids which can trap particles or contaminants and cause reliability problems. Voids can also cause an increase in the resistance of shield electrode and gate electrode and degrade device performance. For many applications, a key performance characteristic of the trench gate FET is its switching speed. To maximize the switching speed of the trench gate FET, it is desirable to minimize the resistivity of its gate material. Accordingly, the methods provided by embodiments of the invention can aid in improving the performance and reliability of trench gate and shielded gate FETs. Additionally, the present techniques are implemented using simple and cost effective processes which can be readily integrated with conventional process technologies. The processes, in accordance with embodiments of the invention, are compatible with conventional process technology without the need for any significant modifications to conventional equipment and processes. Depending upon the embodiment, one or more of these benefits may be obtained. These and other benefits will be described in more detail throughout the present specification and more particularly below.

The above description is directed to n-channel shielded gate FETs according to specific embodiments of the present invention. However, the same techniques can apply to other types of shielded gate trench FETs. For example, while embodiments of the invention are described in the context of n-channel MOSFETs, the principles of the invention may be applied to p-channel MOSFETs by merely reversing the conductivity type of the various regions. Additionally, the principle of the invention can also be applied to shielded gate IGBTs by merely reversing the conductivity of the substrate in the above-described embodiments. For instance, by merely changing the conductivity type of substrate 501 in FIG. 5I from n-type to p-type, n-channel IGBT counterpart of the MOSFETs in FIG. 5I is obtained with the same advantages outlined above. Additionally, P-channel IGBTs can be obtained by reversing the conductivity type of the various regions except for the substrate. Furthermore, the MOSFET and IGBT embodiments referenced herein are vertically conducting devices (i.e., the source and drain interconnects are on opposite surfaces of the device), the techniques according to the invention can also be applied to laterally conducting trench gate MOSFETs and IGBTs (i.e., where the source and drain contacts are both made along the top surface of the device).

While the above provides a complete description of the preferred embodiments of the invention, many alternatives, modifications, and equivalents are possible. Those skilled in the art will appreciate that the same techniques can be used in other applications. Therefore, the above description should not be taken as limiting the scope of the invention, which is defined by the appended claims.

What is claimed is:

1. A trench gate field effect transistor, comprising:
a trench extending into a semiconductor region;
a conductive electrode disposed in the trench, the conductive electrode being insulated from the semiconductor region by a dielectric layer, the conductive electrode including a conductive liner lining the dielectric layer along opposite sidewalls of the trench, the conductive liner having tapered edges such that a thickness of the conductive liner gradually increases from a top surface of the conductive electrode to a point in lower half of the conductive electrode, the conductive electrode further including a conductive fill material filling a center portion of the trench and sandwiched by the conductive liner;
a drift region of a first conductivity type in the semiconductor region;
a body region of a second conductivity type extending over the drift region; and
source regions of the first conductivity type in the body region adjacent the trench.

2. The field effect transistor of claim 1 wherein both the conductive liner and the conductive fill material comprise polysilicon.

3. The field effect transistor of claim 1 wherein the conductive liner comprises polysilicon and the conductive fill material comprises metal-containing material.

4. The field effect transistor of claim 1 wherein the conductive electrode is a gate electrode and the dielectric layer is a gate dielectric layer.

5. The field effect transistor of claim 4 wherein the trench further includes a thick bottom dielectric extending along the bottom of the trench directly below the gate electrode.

6. The field effect transistor of claim 1 wherein the conductive liner is discontinuous along a bottom of the conductive electrode so that the conductive liner comprises discrete conductive spacers extending over the dielectric layer along opposite sidewalls of the trench.

7. The field effect transistor of claim 1 wherein the conductive liner extending along opposite sidewalls of the trench is continuous along a bottom of the conductive electrode.

8. The field effect transistor of claim 1 wherein the conductive electrode is a shield electrode disposed in a lower portion of the trench, and the dielectric layer is a shield dielectric layer lining lower trench sidewalls.

9. The field effect transistor of claim 8 further comprising:
a gate dielectric layer lining upper trench sidewalls, the shield dielectric layer being thicker than the gate dielectric layer;
a gate electrode disposed in the trench over the shield electrode; and
inter-electrode dielectric layer extending laterally between the gate and shield electrodes.

10. The field effect transistor of claim 9 wherein the gate electrode comprises:
a conductive liner lining the gate dielectric layer, the conductive liner of the gate electrode having tapered edges such that a thickness of the conductive liner of the gate electrode gradually increases from a top surface of the gate electrode to a point in lower half of the gate electrode, and
a conductive fill material sandwiched by the conductive liner of the gate electrode.

11. The field effect transistor of claim 1 wherein the top surface of the conductive electrode is non-planar.

12. A field effect transistor, comprising:
a semiconductor region comprising a drift region of a first conductivity type and a body region of a second conductivity type extending over the drift region;
a gate electrode insulated from the body region by a gate dielectric layer;
source regions of the first conductivity type in the body region; and
a heavy body recess extending in the body region, the heavy body recess comprising:
a conductive liner lining opposite sidewalls of the heavy body recess, the conductive liner having tapered edges such that a thickness of the conductive liner gradually increases from the top of the heavy body recess to a point in lower half of the heavy body recess, and
a conductive fill material filling a center portion of the heavy body recess and sandwiched by the conductive liner.

13. The field effect transistor of claim 12 wherein both the conductive liner and the conductive fill material comprise highly doped polysilicon.

14. The field effect transistor of claim 12 wherein the conductive liner comprises doped polysilicon and the conductive fill material comprises metal-containing material.

15. The field effect transistor of claim 12 wherein the gate electrode is disposed in a trench extending through the body region and into the drift region.

16. The field effect transistor of claim 12 wherein the gate electrode is a planar gate laterally extending over the semiconductor region.

17. The field effect transistor of claim 12 wherein the conductive liner is discontinuous along a bottom of the heavy body recess so that the conductive liner comprises discrete conductive spacers extending along opposite sidewalls of the heavy body recess.

18. The field effect transistor of claim 12 wherein the conductive liner extending along opposite sidewalls of the heavy body recess is continuous along a bottom of the heavy body recess.

19. The field effect transistor of claim 12 further comprising a heavy body implant region extending in the body region along a bottom of the heavy body recess, the conductive liner being in direct contact with the heavy body implant region along the bottom of the heavy body recess.

* * * * *